(12) United States Patent
Lamesch

(10) Patent No.: US 9,819,355 B2
(45) Date of Patent: Nov. 14, 2017

(54) CAPACITIVE SENSING SYSTEM AND METHOD

(71) Applicant: IEE International Electronics & Engineering S.A., Echtemach (LU)

(72) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 53 days.

(21) Appl. No.: 14/897,854

(22) PCT Filed: Jun. 11, 2014

(86) PCT No.: PCT/EP2014/062131
§ 371 (c)(1),
(2) Date: Dec. 11, 2015

(87) PCT Pub. No.: WO2014/198775
PCT Pub. Date: Dec. 18, 2014

(65) Prior Publication Data
US 2016/0156366 A1    Jun. 2, 2016

(30) Foreign Application Priority Data

Jun. 11, 2013  (LU) .......................................... 92212

(51) Int. Cl.
*H03M 1/20* (2006.01)
*H03C 3/02* (2006.01)
*H03M 1/12* (2006.01)

(52) U.S. Cl.
CPC ............... *H03M 1/20* (2013.01); *H03C 3/02* (2013.01); *H03M 1/124* (2013.01); *H03M 1/201* (2013.01)

(58) Field of Classification Search
CPC ...... G01R 27/26; G01R 27/2605; G06F 3/044
(Continued)

(56) References Cited

U.S. PATENT DOCUMENTS

| | | | | |
|---|---|---|---|---|
| 6,016,113 A | * | 1/2000 | Binder | H03M 1/201 341/120 |
| 2007/0170931 A1 | * | 7/2007 | Snyder | G01R 27/2605 324/658 |
| 2013/0098890 A1 | * | 4/2013 | Virnich | B60N 2/5685 219/204 |

FOREIGN PATENT DOCUMENTS

| | | |
|---|---|---|
| EP | 0549354 A2 | 6/1993 |
| EP | 0613256 A1 | 8/1994 |

(Continued)

OTHER PUBLICATIONS

"Oversampling Techniques using the TMS320C24x Family" Texas Instruments Europe—Literature No. SPRA461; Texas Instruments Incorporated; Jun. 1998; pp. 1-18.

(Continued)

*Primary Examiner* — Tung X Nguyen
*Assistant Examiner* — Robert P Alejnikov, Jr.
(74) *Attorney, Agent, or Firm* — Reising Ethington P.C.

(57) ABSTRACT

A capacitive sensing system operates according to a method which uses an ADC. The analog signal to be digitized is modulated with a triangular or saw-tooth modulating signal, so that a modulated analog signal is obtained, which is sampled with the ADC. The triangular or saw-tooth signal is chosen to have a peak-to-peak amplitude corresponding at least approximately to an integer multiple L, with L≥1, of the quantization step size of the ADC. The saw-tooth or triangular signal has a number M, of periods per each sequence of N samples. M and N are chosen such that M>1 and M≠N and such that R=r*N/(k*gcd(N, M)*L), where gcd(M, N) is the greatest common divisor of N and M and where k=2 if the modulating signal is a saw-tooth signal and k=4 if the modulating signal is a triangular signal.

7 Claims, 2 Drawing Sheets

(58) Field of Classification Search
USPC .................................................. 324/658, 679
See application file for complete search history.

(56) References Cited

FOREIGN PATENT DOCUMENTS

| FR | 2714553 A1 | 6/1995 |
|----|------------|--------|
| JP | 2009231865 A | 10/2009 |
| WO | 0031553 A1 | 6/2000 |

OTHER PUBLICATIONS

Haralobos C. Papadopoulos et al. "Sequential Signal Encoding from Noisy Measurements Using Quantizers with Dynamic Bias Control", IEEE Transactions on Information Theory, IEEE Press, Mar. 2001, vol. 47, No. 3, XP011027919.
Krause et al. "Effective quantization by averaging and dithering", Measurement, Institute of Measurement and Control; Oct. 2006; vol. 39; No. 8; pp. 981-694; XP027994922.
International Search Report dated Nov. 14, 2014 re: Application No. PCT/EP2014/062131; FR 2 714 553 A1, EP 0 613 256 A1, Papadopoulos et al., Krause et al.,U.S. 2007/170931 A1, WO 00/31553 A1, JP 2009 231865 A and EP 0 549 354 A2.
Written Opinion for corresponding application PCT/EP2014/062131 filed Jun. 11, 2014;dated Nov. 14, 2014.

\* cited by examiner

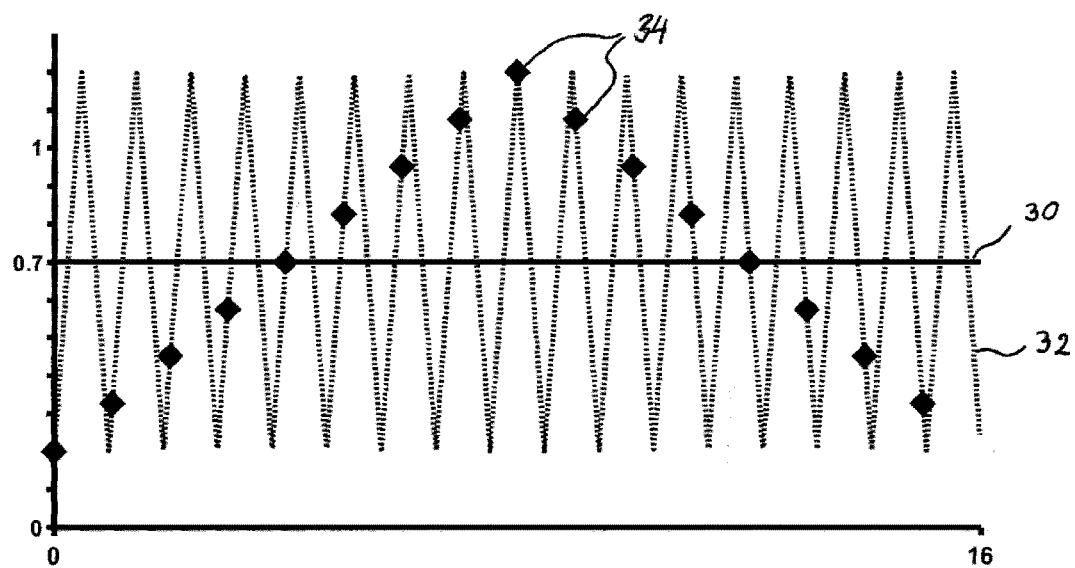

CAPACITIVE SENSING SYSTEM AND METHOD

TECHNICAL FIELD

The present invention generally relates to a method for converting an analog signal into a digital signal. More particularly, the invention relates to a method used for converting a voltage in a measurement circuit into a digital signal e.g. in a capacitive sensing system.

BACKGROUND ART

Analog-to-digital conversion is a very important aspect in the processing of analog measurement signals. An analog-to-digital converter (ADC) samples the analog signal with predefined resolutions in time (the sampling rate) and signal quantity, respectively. In the following, the term "resolution" designates the resolution in signal quantity or amplitude resolution, i.e. the number of discrete levels over the range of the analog signal quantity, except when explicitly specified otherwise in the text. The resolution r of an analog-to-digital converter corresponds to the number of levels available to approximate the analog signal. When the resolution of an ADC is indicated as a number B of bits, the relationship between B and the resolution r is $B=\log_2(r)$ or $r=2^B$. Each digital sample corresponds to a discrete "reconstruction value", which is one among the r possible digital values to which of the analog signal is mapped by the quantizer of the ADC at the times corresponding to the samples. The higher the resolution r, the more accurately the digital signal reproduces the analog signal. However, as analog-to-digital converters with a higher resolution are more expensive, their use in low-cost applications is often not possible for economical reasons.

If the analog signal quantity only changes by a small amount, the variation may not be visible in the digital signal. This is due to the limited resolution of the analog-to-digital converter. The minimum change in the analog signal that is required to guarantee, irrespectively of the initial value of the analog signal, a change in the digital signal is called the "step size" or "quantization step size". If the analog signal changes by one step size, the digital signal undergoes a change corresponding to the addition or subtraction of one least significant bit (LSB).

According to a known method, the resolution of the conversion from an analog signal into a digital signal can be improved by adding white noise (Gaussian noise) on the analog signal before sampling. By modulating the analog signal with white noise, the digital values, obtained through the sampling, spread. Groups of subsequent samples of equal length are formed and an average is calculated over each group. The sequence of averages corresponds to a digital representation of the analog signal with higher resolution in signal quantity but with lower resolution in time. The method thus emulates an analog-to-digital conversion with lower sampling rate but higher resolution (or quantization).

Another method is described in the publication "TMS320C24x Family" from Texas Instruments Europe (Literature number: SPRA461, June 1998). The method uses a triangular signal instead of white noise to modulate the analog signal. The peak-to-peak amplitude of the triangular signal is chosen equal to the step size of the ADC or an integer multiple thereof. The analog modulated signal is sampled with a rate k times higher than the frequency of the triangular signal, where k=2, 4, 8, . . . "k" is called the oversampling factor. For each period of the triangular signal, k reconstruction values are obtained from the ADC. Averaging over the k reconstruction values yields a more accurate approximation of the analog signal, if the original analog signal can be assumed substantially constant on the time scale of one period of the modulation. To further increase the resolution, the oversampling factor k (which is equal to the number of sampling points per period of the triangular signal) has to be increased. When using a low-cost and, hence, slow, ADC, this will necessitate generating a triangular signal with a long period. However, to generate such a triangular wave with a large period, large capacitors and large resistors are required, which may not be available at low cost nor be convenient for demanding operation environments (for instance, some automotive manufacturers prohibit the use of resistors above 100 k$\Omega$.) Furthermore, the electrical circuit as described in the publication "TMS320C24x Family" needs an additional amplifier to sum the analog signal and the triangular wave signal. Hence, it is desirable to find more cost efficient solutions.

BRIEF SUMMARY

The disclosure seeks to increase the overall resolution of analog-to-digital conversion process of a capacitive sensing system, while offering the possibility of low-cost implementation.

A capacitive sensing system for determining a capacitance between a sensing electrode and a grounded counter electrode comprises a reference capacitor operatively coupled between a power supply and ground, a multiplexer operatively connected to said sensing electrode for alternately connecting said sensing electrode between ground and a measuring node, said measuring node between said reference capacitor and said power supply, and an evaluation unit operatively coupled to said measuring node, said evaluation unit for converting an analog signal on said measurement node into a digital signal with a first maximum amplitude resolution R. In accordance with the present invention, the evaluation unit comprises modulation circuitry operatively coupled to an analog signal input and configured to modulate said analog signal with a triangular or saw-tooth modulating signal, an analog-to-digital converter (ADC converter) having a second maximum amplitude resolution, hereinafter denoted r, and a quantization step size, said analog-to-digital converter being operatively connected to said modulation circuitry and configured to sample said modulated analog signal and to produce digital samples, and a processor operatively connected to said analog-to-digital converter for receiving said digital samples. The processor is configured to average over a number, hereinafter denoted N, of said digital samples, with N>1. The modulation circuitry is configured such that said triangular or saw-tooth modulating signal has a peak-to-peak amplitude corresponding at least approximately to an integer multiple, hereinafter denoted L, of said quantization step size of said analog-to-digital converter, with L≥1, such that said modulating analog signal has an number; hereinafter denoted M, of periods per each sequence of N samples, M and N being chosen such that M>1 and M≠N and such that $R=r*N/(k*\gcd(N, M)*L)$, where gcd(M, N) denotes the greatest common divisor of N and M and where k=2 if the modulating signal is a saw-tooth modulating signal and k=4 if the modulating signal is a triangular modulating signal.

the above capacitive sensing system operates according to a method which uses an analog-to-digital converter (ADC) with a low resolution, hereinafter denoted 'r', to produce a digital signal with a higher resolution, hereinafter denoted 'R'. The resolution R will also be referred to as the first resolution, whereas the resolution r of the ADC will also be referred to as the second resolution. The method comprises the following steps. The analog signal to be digitized is modulated with a triangular or saw-tooth modulating signal, so that a modulated analog signal is obtained. The modulated analog signal is sampled with the analog-to-digital converter that has the resolution r, whereby digital samples are produced. An average is taken over a number, hereinafter denoted 'N', of successive digital samples, with N>1. The triangular or saw-tooth modulating signal is chosen to have a peak-to-peak amplitude corresponding at least approximately to an integer multiple, hereinafter denoted L, with $L \geq 1$, of the quantization step size of the ADC. The modulating saw-tooth or triangular signal, furthermore, has a number, hereinafter denoted 'M', of periods per each sequence of N samples, i.e. it repeats itself M times every N samples. M and N are chosen such that M>1 and M≠N and such that $R=r*N/(k*gcd(N, M)*L)$, where $gcd(M, N)$ stands for the greatest common divisor of N and M and where k=2 if the modulating signal is a saw-tooth modulating signal and k=4 if the modulating signal is a triangular modulating signal. In practice, the upper limit for N is given by the fact that the input analog signal is not constant. Accordingly, an upper limit for N could be 32. A peak-to-peak amplitude corresponding to an integer multiple of the quantization step size of the ADC is preferred, since a deviation from such an integer multiple may lead to non-linearity errors. Such non-linearity errors will be acceptable only to a certain extent, which may depend on the context in which the method is applied.

The method can be used, for instance, in capacitive or resistive measurement circuits. Specifically, the method can be used in capacitive person-sensing or gesture-sensing applications, e.g. in occupant detection systems in vehicles, in particular, for the seat belt reminder (SBR) function or for activating/deactivating seat heaters or security features such as, e.g., airbags.

According to a preferred embodiment of the invention, the number M of periods of the modulating signal per each sequence of N samples is defined by the relationship M=N+1 or M=N−1. Other combinations of M and N can also be used. Particularly advantageous are combinations satisfying $gcd(M,N) \leq N/(k*L)$. Even more advantageously, M and N are chosen such that they are coprime, i.e. $gcd(M,N)=1$.

Preferably, $N=2^n$, where n is a positive integer, e.g. 16, 32, 64, etc. The resolution r of the ADC may be anything greater than or equal to 1 bit ($r \geq 2$).

According to a preferred embodiment of the invention, the quantization step size is equal to the peak-to-peak amplitude of the triangular or saw-tooth modulating signal. As indicated above, the peak-to-peak amplitude of the triangular or saw-tooth modulating signal may be chosen equal to L times the quantization step size but this reduces the achievable resolution R for given M and N.

The triangular or saw-tooth modulating signal can result from a modified square wave signal. Square wave signals are readily available from microcontrollers, e.g. on PWM (pulse-width modulation) outputs thereof. Therefore, it is particularly advantageous to modify the generated square wave signal in such a way that it results in the desired triangular or saw-tooth modulating signal. To turn the square wave signal into the triangular or saw-tooth modulating signal, a low-pass filter can be used. The low-pass filter may comprise a resistor and a capacitor.

The invention further relates to a device for converting an analog signal into a digital signal with the first resolution R. The device comprises modulation circuitry configured to modulate the analog signal with the triangular or saw-tooth modulating signal, an ADC having the second resolution r and a processor operatively connected to the ADC for receiving the digital samples produced by the ADC and configured to average over every sequence of N digital samples. The modulation circuitry is configured such that the triangular or saw-tooth modulating signal has the frequency and the amplitude specified hereinabove.

According to a preferred embodiment of the device in accordance with invention, the device comprises a low-pass filter for filtering a square wave signal to result in the triangular or saw-tooth modulating signal. The low-pass filter can e.g. comprise a resistor and a capacitor. To produce the square wave signal, the device may comprise a microcontroller.

As will be appreciated, the processor that averages over each sequence of N digital samples can be part of the microcontroller that outputs the square wave signal. The ADC with the low resolution r may also be part of the microcontroller.

The device may be used to convert an analog measurement signal in a capacitive or a resistive measurement circuit. According to a preferred embodiment, the device is used as a part of a capacitive measurement circuit for proximity sensing applications, e.g. detection of an occupant on a vehicle seat.

BRIEF DESCRIPTION OF THE DRAWINGS

Further details and advantages of the present invention will be apparent from the following detailed description of several not limiting embodiments with reference to the attached drawings, wherein:

FIG. 3 is an illustration of the values of the modulated analog signal at the instants at which that signal is sampled;

FIG. 4 illustrates the reconstruction values obtained through the sampling of the modulated analog signal.

DESCRIPTION OF PREFERRED EMBODIMENTS

Figure 1:
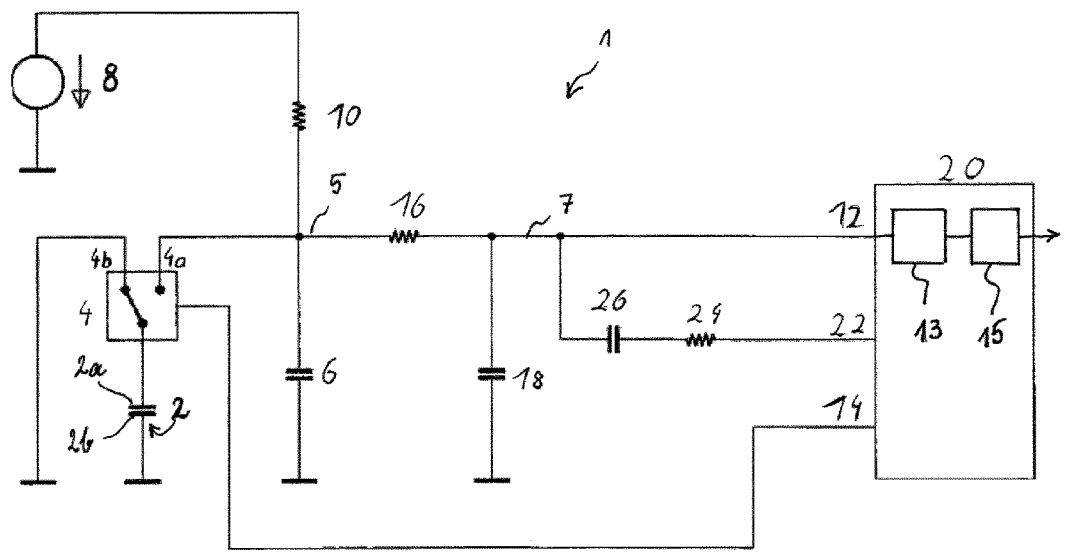
FIG. 1 is a schematic view of a capacitive sensing circuit, wherein the analog signal indicative of the capacitance to be sensed is converted into a digital signal in accordance with a first embodiment of the invention.

FIG. 1 shows a capacitance measurement circuit 1 configured to execute the method according to a preferred embodiment of the invention. The capacitance to be measured, represented in FIG. 1 by capacitor 2, is connected in a switched-capacitor configuration. The capacitance measurement circuit 1 comprises a multiplexer 4, which alternately connects the sensing electrode 2a of the capacitor 2 to ground and to a capacitor 6. The multiplexer 4 is configured to switch non-overlappingly, i.e. the sensing electrode 2a is connected either to ground or to the capacitor 6 but never to both at a time. Through the switching of the multiplexer 4, the capacitor 2 is repeatedly charged and uncharged. In charging position, the switch connects the sensing electrode 2a of capacitor 2 to terminal 4a and thereby directly to capacitor 6. Since capacitor 6 is continuously charged, across resistor 10, by the constant voltage source 8, charge is transferred from capacitor 6 to capacitor 2 each time the multiplexer 2 is in its charging position. In discharging position, the multiplexer 4 connects the sensing electrode 2a of capacitor 2 to terminal 4b and thus to ground; as a consequence, capacitor 2 is partly uncharged. After a certain settling time corresponding to several switching operations, the DC voltage on the node 5 is a function of the DC voltage of the voltage source 8, resistance 10, the switching frequency of the multiplexer 4 and the unknown capacitance.

The switching action of multiplexer 4 is controlled by an alternating square wave signal from the square wave output 14 of a microcontroller 20. Depending on the complex conductance between the sensing electrode 2a and the grounded counter electrode 2b, the charge transferred from capacitor 6 to capacitor 2 varies. This results in a variation of the DC voltage on the node 5.

Due to the switching action of the multiplexer 4, the voltage on the node 5 contains AC voltage ripples. To get rid of these on the node 7, an RC low-pass filter (comprising resistor 16 and capacitor 18) is provided. The voltage on the node 7 is thus indicative of the capacitance to be measured and is input to an analog-to-digital converter input 12 of the microcontroller 20.

Prior to converting the analog signal into a digital signal with a resolution R, the analog signal is modulated with a substantially triangular modulating signal. On its PWM output 22, the microcontroller 20 makes available a square wave signal. The square wave signal is filtered with an RC low-pass filter formed by resistor 24 and capacitor 18. The result of the filtering is a substantially triangular analog signal, which is modulated on the voltage to be measured via capacitor 26. The function of the capacitor 26 is to AC-couple the PWM-output 22 with the ADC input while preventing the resistor 24 from attenuating the analog signal on node 7.

The modulated analog signal entering the microcontroller 20 at the input 12 is sampled by an integrated ADC (represented as ADC functional block 13). The resolution r (second resolution) of the integrated ADC is lower than the overall resolution R (first resolution) to be achieved. A processor unit 15 averages over every sequence of N samples output by the ADC. Preferably $N=2^n$, with $n \geq 2$ and n integer. The frequency of the square wave signal and, hence, the frequency of the triangular signal is chosen equal to $M/N*f_{ADC}$, where M is an integer and $f_{ADC}$ is the sampling frequency of the integrated ADC. M and N are preferably chosen close and coprime to each other. Preferred choices would thus be $M=N-1$ or $M=N+1$.

FIG. 3 illustrates the sampling for the case N=16 and M=17. The analog signal 30 to be sampled is assumed to be constant on the timescale of N sampling intervals. For simplicity, the ADC may be supposed to have a resolution of 1 bit (r=2); if the ADC has a higher resolution, this assumption merely corresponds to "zooming in" on the least significant bit. The ADC outputs a digital 0 (corresponding e.g. to a reconstruction value of 0 V) if the value of analog signal is below 0.5 V and a digital 1 (corresponding e.g. to a reconstruction value of 1 V) otherwise. When the analog signal level amounts to 0.7 V, the ADC thus outputs 1 V, i.e. the error is 0.3 V. When modulated with the triangular modulating signal having a peak-to-peak amplitude corresponding to one quantization step size of the ADC (here: 1 V), the analog signal oscillates about the constant value (curve 32). The ADC samples the modulated analog signal at the beginning of each sampling interval using a sample-and-hold circuit. Preferably, the aperture interval of the sample and hold circuit is at most 5%, e.g. 1%, of the triangular wave period. The values of the modulated analog signal at the instants of the sampling spread regularly over the range (the width of which amounts to one quantization step size in this example) between the maximum and minimum values of the modulated analog signal and are indicated as solid diamonds 34 in FIG. 3. In consequence, the ADC now outputs 5 times a reconstruction value 36 of 0 V and 11 times a reconstruction value 38 of 1 V, per sequence of 16 sampling intervals (FIG. 4). The average reconstruction value over the 16 samples amounts to $^{11}/_{16}=0.6875$ V, i.e. the error is much lower. Applying the above formula $R=r*N/(k*gcd(N, M)*L)$, one finds an overall (target) resolution R of $r*4$ (k=4 for a triangular modulating signal, and L=1 in this example), i.e. R=8 if r=2.

It shall be noted that the same resolution R may be obtained for other choices of M, if N is given, if M and N are coprime to each other. There is a considerable advantage in choosing M close to N, because the short period of the triangular wave allows a low-cost implementation, using the low-pass formed by the resistor 24 and the capacitor 18. The cutoff frequency of the low-pass filter can be set substantially lower than the triangular wave frequency because the peak-to-peak amplitude merely needs to amount to one quantization step size of the ADC, leading to an acceptable approximation of a triangular wave using the low-pass. Specifically, an RC low-pass filter, when driven with a voltage step, will output a voltage proportional to $1-\exp(-t/RC)$. When only using a small portion of the start of the output signal, the $1-\exp(-t/RC)$ function will approximate a linear function $f(x)=a \cdot x$. However, as this approximation only useable for a small portion of the start of the RC output signal, the usable peak output voltage is also small. The low RC output signal amplitude is no problem for this application however, because one ADC LSB (quantization step size) corresponds to the supply voltage divided by $2^B$, while the supply voltage is also used by the PWM generator. Consequently, the allowed RC low-pass attenuation is $2^B$, which is 256 for an 8-bit ADC.

On the other hand, it may be advantageous not to choose too high a value for M because this necessitates a faster sample-and-hold circuit within the ADC.

It is worthwhile noting that the increase in resolution from r to R comes at the price of a lower overall sampling rate. Indeed, if the sampling rate of the integrated ADC is $f_{ADC}$, the output rate of the averaged samples amounts to $f_{ADC}/N$. Nevertheless, a reduced overall sampling rate will be acceptable in many applications.

Figure 2:
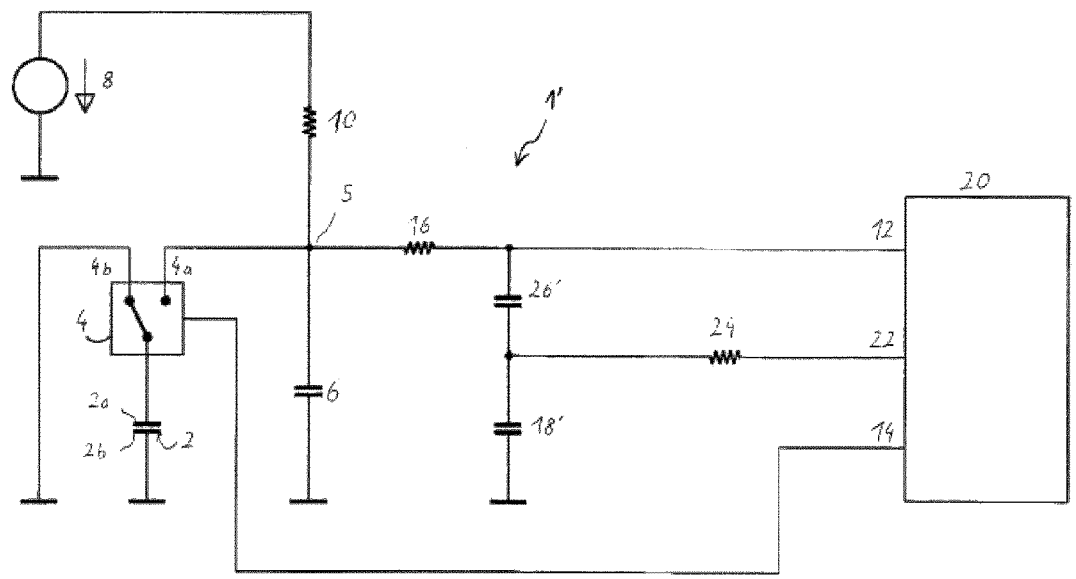
FIG. 2 is a schematic view of a variant of the capacitive sensing circuit of FIG. 1.

FIG. 2 shows a variant 1' of the capacitance measurement circuit 1 of FIG. 1. Only the differences with respect to FIG. 1 will be discussed. Whereas in the capacitance measurement circuit of FIG. 1, the AC ripples on the signal to be measured are removed by the low-pass filter formed by resistor 16 and capacitor 18, the same function is fulfilled in the capacitance measurement circuit of FIG. 2 by the low-pass filter formed by resistor 16 and the series of capacitors 18' and 26'. Furthermore, in FIG. 2, the resistor 24 and the capacitor 18' form the low-pass that transforms the square wave output by the microcontroller 20 into the triangular signal.

While specific embodiments have been described in detail, those skilled in the art will appreciate that various modifications and alternatives to those details could be developed in light of the overall teachings of the disclosure. Any numerical values indicated herein are also provided only for the purpose of illustration. Accordingly, the particular arrangements disclosed are meant to be illustrative only and not limiting as to the scope of the invention, which is to be given the full breadth of the appended claims and any and all equivalents thereof.

The invention claimed is:

1. A capacitive sensing system for determining a capacitance between a sensing electrode and a grounded counter electrode, said capacitive sensing system comprising:
   a reference capacitor operatively coupled between a power supply and ground,
   a multiplexer operatively connected to said sensing electrode for alternately connecting said sensing electrode between ground and a measuring node, said measuring node between said reference capacitor and said power supply, and
   an evaluation unit operatively coupled to said measuring node, said evaluation unit for converting an analog signal on said measurement node into a digital signal with a first maximum amplitude resolution R,
   wherein said evaluation unit comprises:
   modulation circuitry operatively coupled to an analog signal input and configured to modulate said analog signal with a triangular or saw-tooth modulating signal,
   an analog-to-digital converter (ADC converter) having a second maximum amplitude resolution (r) and a quantization step size, said analog-to-digital converter being operatively connected to said modulation circuitry and configured to sample said modulated analog signal and to produce digital samples, and
   a processor operatively connected to said analog-to-digital converter for receiving said digital samples and configured to average over a number (N) of said digital samples, with N>1;
   wherein said modulation circuitry is configured such that said triangular or saw-tooth modulating signal has a peak-to-peak amplitude corresponding at least approximately to an integer multiple (L) of said quantization step size of said analog-to-digital converter, with $L \geq 1$, such that said modulating analog signal has an number (M) of periods per each sequence of N samples, M and N being chosen such that M>1 and M≠N and such that R=r*N/(k*gcd(N, M)*L), where gcd(M, N) denotes the greatest common divisor of N and M and where k=2 if the modulating signal is a saw-tooth modulating signal and k=4 if the modulating signal is a triangular modulating signal.

2. The capacitive sensing system according to claim 1, wherein M=N+1 or M=N−1.

3. The capacitive sensing system according to claim 1, wherein said modulation circuitry comprises circuitry for generating a square wave signal, said square wave signal being converted into said triangular or saw-tooth modulating signal.

4. The capacitive sensing system according to claim 3, wherein said modulation circuitry comprises a low-pass filter for converting said square wave signal into said triangular or saw-tooth modulating signal.

5. The capacitive sensing system according to claim 4, wherein said low-pass filter comprises a resistor and a capacitor.

6. The capacitive sensing system according to claim 3, wherein said square wave signal is generated by a microcontroller.

7. The capacitive sensing system according to claim 1, further comprising a low pass filter operatively coupled between said measuring node and said evaluation unit.

* * * * *